US 6,670,861 B1

(12) United States Patent
Balboni

(10) Patent No.: US 6,670,861 B1
(45) Date of Patent: Dec. 30, 2003

(54) METHOD OF MODULATION GAIN CALIBRATION AND SYSTEM THEREOF

(75) Inventor: Edmund Balboni, Littleton, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/230,763

(22) Filed: Aug. 29, 2002

(51) Int. Cl.[7] .................................................. H03K 3/00
(52) U.S. Cl. ....................... 332/103; 332/104; 330/129; 375/308; 455/127.2
(58) Field of Search ................................ 332/103–105; 330/129; 375/308; 455/127.2

(56) References Cited

U.S. PATENT DOCUMENTS

| 5,648,744 | A | | 7/1997 | Prakash et al. ................ 331/11 |
| 6,034,573 | A | * | 3/2000 | Alderton ...................... 332/125 |
| 6,137,372 | A | | 10/2000 | Welland .................. 331/117 R |
| 6,421,397 | B1 | * | 7/2002 | McVey ........................ 375/308 |
| 6,515,553 | B1 | * | 2/2003 | Filiol et al. .................. 332/127 |

OTHER PUBLICATIONS

"A Fully Integrated CMOS DCS–1800 Frequency Synthesizer"; Craninckx et al.; IEE Journal of Solid–State Circuits, vol. 33, No. 12, Dec. 1998; pp.: 2054–2065.

* cited by examiner

Primary Examiner—Kenneth B. Wells
(74) Attorney, Agent, or Firm—Samuels, Gauthier & Stevens, LLP

(57) ABSTRACT

A wideband impedance attenuator includes a phase-locked loop filter, a voltage-controlled oscillator connected to the phase-locked loop filter during transmit, and an impedance circuit connected to the phase-locked loop filter and the voltage controlled oscillator. The impedance circuit is a scaled version of the phase-locked loop filter. Moreover, the wideband impedance attenuator attenuates a Gaussian frequency shift key modulation signal by a factor of $1/(N+1)$ using the impedance circuit, which has an impedance of $N*Z(s)$, and the phase-locked loop filter, which has an impedance of $Z(s)$. An output frequency is generated using a voltage-controlled oscillator wherein the output frequency corresponds to the attenuated Gaussian frequency shift key modulation signal. In addition, a comparator compares a voltage of an output from the programmable gain amplifier with a voltage necessary to produce a predetermined frequency shift in a voltage-controlled oscillator to produce a gain signal. A gain controller, in response to the gain signal produced by the comparator, controls a gain of the programmable gain amplifier.

20 Claims, 8 Drawing Sheets

METHOD OF MODULATION GAIN CALIBRATION AND SYSTEM THEREOF

FIELD OF THE PRESENT INVENTION

The present invention is directed to wideband modulation in a communication device using a phase-locked loop and voltage-controlled oscillator. More particularly, the present invention is directed to a wideband modulation summing network that scales a voltage signal being fed to a voltage-controlled oscillator and a calibration gain circuit that controls the scaling of the modulated signal.

BACKGROUND OF THE PRESENT INVENTION

Phase-locked loops are used in a variety of applications such as clock recovery, frequency and phase modulation, and frequency synthesizers. A voltage-controlled oscillator is a central design element of the phase-locked loop, whereby the voltage-controlled oscillator produces an output frequency proportional to its input voltage. A typical drawback of a voltage-controlled oscillator is its uncertainty in output frequency to the applied input voltage due to integrated circuit process variations. This leads to the need for a voltage-controlled oscillator having a large gain if a wide output frequency range is required. The large voltage-controlled oscillator gain also has the effect of producing a large variation in the output frequency in response to any noise in the applied input voltage, also known as phase noise. This phase noise at the voltage-controlled oscillator output is undesirable as this limits the accuracy of the output signal.

As noted above, a common application of voltage-controlled oscillators are within wireless communication systems. Wireless communication systems typically require frequency synthesis in both the receive path circuitry and the transmit path circuitry. For example, cellular phone standards in the United States and Europe define a cellular telephone system with communication centered in two frequency bands at about 900 MHz and 1800 MHz.

A dual band cellular phone is capable of operating in both the 900 MHz frequency band and the 1800 MHz frequency band. Within the frequency bands, the cellular standards define systems in which base station units and mobile units communicate through multiple channels, such as 30 kHz (IS-54) or 200 kHz (GSM) wide channels. For example, with the IS-54 standard, approximately 800 channels are used for transmitting information from the base station to the mobile unit, and another approximately 800 channels are used for transmitting information from the mobile unit to the base station. A frequency band of 869 MHz to 894 MHz and a frequency band of 824 MHz to 849 MHz are reserved for these channels, respectively.

Because the mobile unit must be capable of transmitting and receiving on any of the channels for the standard within which it is operating, a frequency synthesizer must be provided to create accurate frequency signals in increments of the particular channel widths, such as for example 30 kHz increments in the 900 MHz region.

Phase-locked loop circuits including voltage-controlled oscillators are often used in mobile unit applications to produce the desired output frequency. An example of a phase-locked loop circuit in mobile applications is illustrated in FIGS. 1 and 2.

FIG. 1 is a block diagram example of a receive path circuitry 150 for a prior art wireless communication device, such as a mobile unit in a cellular phone system. An incoming signal is received by the antenna 108, filtered by a band-pass filter 110, and amplified by a low noise amplifier 112. This received signal is typically a radio-frequency signal, for example a 900 MHz or 1800 MHz signal. This radio-frequency signal is usually mixed down to a desired intermediate frequency before being mixed down to baseband. Using a reference frequency ($f_{REF}$) 106 from a crystal oscillator 105, frequency synthesizer 100 provides an RF mixing signal $RF_{OUT}$ 102 to mixer 114. Mixer 114 combines this $RF_{OUT}$ signal 102 with the filtered and amplified input signal 113 to produce a signal 115 that has two frequency components. The signal is filtered by band-pass filter 116 to provide an IF signal 117. This IF signal 117 is then amplified by variable gain amplifier 118 before being mixed down to baseband by mixers 122 and 124.

Signal processing in mobile phones is typically conducted at baseband using in-phase (I) and quadrature (Q) signals. The Q signal is offset from the I signal by a phase shift of 90 degrees. To provide these two signals, an IF mixing signal 104 and a dual divide-by-two and quadrature shift block 120 may be utilized. Frequency synthesizer 100 generates an $IF_{OUT}$ signal 104; for example, at about 500 MHz; that is divided by 2 in block 120 to provide mixing signals 119 and 121. Block 120 delays the signal 121 to mixer 122 by 90 degrees with respect to the signal 119 to mixer 124.

Block 120 may be implemented with two flip-flop circuits operating off of opposite edges of the signal 104, such that the output of the flip-flops are half the frequency of the signal 104 and are 90 degrees offset from each other. The resulting output signals 123 and 125 have two frequency components.

Assuming the baseband frequency is centered at DC, the signal is filtered using low-pass filters 126 and 128. The resulting baseband signal 123 is the Q signal, and the resulting baseband signal 125 is the I signal. These signals 123 and 125 may be further processed at baseband by processing block 130 and provided to the rest of the mobile phone circuitry as I and Q signals 131 and 132.

FIG. 2 is a block diagram of a prior art phase-locked loop circuitry 200 for synthesizing one of the frequencies required by frequency synthesizer 100. A second phase-locked loop circuit may be implemented to provide the second frequency.

The reference frequency 106 is received by a divide-by-R counter 204, and the output frequency 102 is received by a divide-by-N counter 214. The resulting divided signals 216 and 218 are received by a phase detector 206. The phase detector 206 determines the phase difference between the phase of the divided signal 216 and the phase of the divided signal 218. The phase detector 206 uses this phase difference to drive a charge pump 208. The charge pump 208 provides a voltage output that is filtered by a loop filter 210 to provide a voltage control signal 220. The voltage control signal 220 controls the output frequency 102 of a voltage-controlled oscillator 212.

For a typical mobile phone application, the frequency 104 will remain constant, while the frequency 102 will change depending upon the channel of the incoming signal. Thus, a first phase-locked loop may be used to provide the frequency 104, and its N and R values may be programmed once and then left alone. A second phase-locked loop may be used to provide the frequency 102, and its N and R values may be selectively programmed to provide the desired signal 102. If desired, the R value for this second phase-locked loop may be programmed once and left alone, while the N value may be used to select the desired signal 102.

The typical transmit path circuitry (not shown) for a wireless communication device, such as a mobile unit in a cellular phone system, may include circuitry to move the outgoing signal from baseband to an RF transmission frequency. A transmit frequency band for cellular phone systems typically includes the identical number of channels as included within the receive frequency band. The transmit channels, however, are shifted from the receive channels by a fixed frequency amount.

As noted above, the phase-locked loop circuitry typically utilizes a phase detector to monitor phase differences between the divided reference frequency and the divided output frequency to drive a charge pump. The charge pump delivers packets of charge proportional to the phase difference to a loop filter.

The loop filter outputs a voltage that is connected to the voltage-controlled oscillator to control its output frequency. The action of this feedback loop attempts to drive the phase difference to zero to provide a stable and programmable output frequency. The values for the reference frequency and the divider circuits may be chosen depending upon the standard under which the mobile unit is operating.

The performance of the communication system, however, is critically dependent on the purity of the synthesized high-frequency output signals. For signal reception, impure frequency sources result in mixing of undesired channels into the desired channel signal. For signal transmission, impure frequency sources create interference in neighboring channels.

A frequency synthesizer, therefore, must typically meet very stringent requirements for spectral purity. The level of spectral purity required in cellular telephone applications makes the design of a phase-locked loop synthesizer solution and, in particular, the design of a voltage-controlled oscillator within a phase-locked loop synthesizer solution quite demanding.

Three types of spectral impurity will typically occur in voltage-controlled oscillator circuits that are used in phase-locked loop implementations for frequency synthesis: harmonic distortion terms associated with output frequency, spurious tones near the output frequency, and phase noise centered on the output frequency.

Generally, harmonic distortion terms are not too troublesome because harmonic distortion terms occur far from the desired fundamental and harmonic distortion terms' effects may be eliminated in cellular phone circuitry external to the frequency synthesizer.

Spurious tones, however, often fall close to the fundamental. Spurious tones, including reference tones, may be required by a cellular phone application to be less than about −70 dBc, while harmonic distortion terms may only be required to be less than about −20 dBc. It is noted that the "c" indicates the quantity as measured relative to the power of the "carrier" frequency, which is the output frequency.

Phase noise is undesired energy spread continuously in the vicinity of the output frequency, invariably possessing a higher power density at frequencies closer to the fundamental of the output frequency. Phase noise is often the most damaging of the three to the spectral purity of the output frequency. Since the effect phase noise has on system performance, a typical cellular application might require the frequency synthesizer to produce an output frequency having phase noise of less than about −110 dBc/Hz at 100 kHz from the output frequency.

Moreover, since the phase noise specifications are so stringent in cellular phone applications, the voltage-controlled oscillators used in cellular phone phase-locked loop synthesizer solutions are typically based on some resonant structure. Ceramic resonators and LC tank circuits are common examples. While details in the implementation of LC tank oscillators differ, the general resonant structure includes an inductor connected in parallel with a fixed capacitor and a variable capacitor.

Since energy is dissipated in any real oscillator, power in the form of a negative conductance source, such as an amplifier, is applied to maintain the oscillation. It is often the case that the series resistance of the inductor is the dominant loss mechanism in an LC tank oscillator, although other losses typically exist.

It is highly desirable to integrate the voltage-controlled oscillator with the other components of the phase-locked loop onto a single integrated circuit from a cost perspective. The cost associated with the off-chip components, package-pins, integrated circuit test, board-level test, and degraded implementation reliability all favors an integrated solution. The integrated voltage-controlled oscillator and phase-locked loop filter is also less sensitive to electromagnetic interference and radio frequency interference since the voltage-controlled oscillator and phase-locked loop filter are completely contained in a small volume on the integrated circuit with no external connections.

An integrated phase-locked loop filter needs to use relatively small capacitors (100's pf) in comparison to traditional off-chip implementations (100's nf). The smaller capacitors result in more phase-locked loop open-loop gain, which must be compensated by making the charge pump current smaller and/or making the sensitivity of the voltage-controlled oscillator smaller. Decreasing the charge pump current increases the relative noise of the charge pump and decreases the phase-locked loop slew rate.

In contrast, decreasing the sensitivity of the voltage-controlled oscillator makes it less sensitive to noise on the tuning port and tends to improve noise performance. However, the dynamic range of the voltage-controlled oscillator becomes narrow which requires that the voltage-controlled oscillator center frequency be trimmed for process variations, temperature, and desired channel.

Another barrier to integration is the lack of precision in the values of the inductors and capacitors used in the LC tank of the phase-locked loop. This tolerance problem typically forces most phase-locked loop synthesizer implementations to modify the inductor or capacitor values during production, for example, by laser trimming. Further complicating integration is the difficulty in integrating an inductor with a low series resistance and a capacitor with a reasonably high value and with low loss and low parasitic characteristics.

In integrating capacitance values, a significant problem is the high value of a typical loop filter capacitor component, which is often on the order of 500pf to 5000pf. Another significant problem is the absence of a variable capacitance component that possesses a highly-variable voltage-controlled capacitance that is not also a high loss component that causes phase noise. To provide this variable capacitance component, a high-precision reverse-biased diode or varactor is typically utilized. However, such high-performance varactors require special processing and, therefore, have not been subject to integration with the rest of the phase-locked loop circuitry.

In short, although integration onto a single integrated circuit of a phase-locked loop implementation for synthesizing high-frequency signals is desirable for a commercial cellular phone application, integration has yet to be satisfactorily achieved.

Therefore, it is desirable to integrate a phase-locked loop with a voltage-controlled oscillator that provides an accurate low power transmitter/receiver. Moreover, it is desirable to provide an integrated phase-locked loop and a voltage-controlled oscillator, which enables on-chip trimming to be implemented. Lastly, it is desirable to provide an integrated phase-locked loop and a voltage-controlled oscillator that has high quality modulation and low power consumption.

SUMMARY OF THE PRESENT INVENTION

A first aspect of the present invention is a wideband impedance attenuator. The wideband impedance attenuator includes a phase-locked loop filter, a voltage controlled oscillator operatively connected to the phase-locked loop filter during transmit, and an impedance circuit operatively connected to the phase-locked loop filter and the voltage controlled oscillator.

A second aspect of the present invention is a wideband impedance attenuator. The wideband impedance attenuator includes a first impedance, a voltage controlled oscillator operatively connected to the first impedance during transmit, and a second impedance operatively connected to the first impedance and the voltage controlled oscillator. The second impedance circuit is a scaled version of the first impedance.

A third aspect of the present invention is a method of generating an output frequency from a Gaussian frequency shift key modulation signal. The method attenuates the Gaussian frequency shift key modulation signal by a factor of $1/(N+1)$ using an impedance circuit having an impedance of $N*Z(s)$ and a phase-locked loop filter having an impedance of $Z(s)$ and generates an output frequency using a voltage controlled oscillator. The output frequency corresponds to the attenuated Gaussian frequency shift key modulation signal.

A fourth aspect of the present invention is a modulator gain calibration circuit. The modulator gain calibration circuit includes a programmable gain amplifier to receive either a signal from a modulator or a calibration signal, a comparator for comparing a voltage of an output from the programmable gain amplifier with a voltage necessary to produce a predetermined frequency shift in a voltage-controlled oscillator to produce a gain signal, and a gain controller, in response to the gain signal produced by the comparator, to control a gain of the programmable gain amplifier.

Another aspect of the present invention is a method of calibrating a gain of a modulator. The method locks a voltage controlled oscillator at a center frequency of a band; measures a voltage of the locked voltage controlled oscillator; shifts the voltage controlled oscillator to produce a predetermined frequency; measures a voltage of the shifted voltage controlled oscillator; determines a difference between the measured voltage of the locked voltage controlled oscillator and the measured voltage of the shifted voltage controlled oscillator; and changes a gain of the modulator based on the determined difference.

A further aspect of the present invention is a modulation circuit. The modulation circuit includes a Gaussian frequency shift key generator; a modulator; a programmable gain amplifier to receive either a signal from the modulator or a calibration signal; a comparator for comparing a voltage of an output from the programmable gain amplifier with a voltage necessary to produce a predetermined frequency shift in a voltage-controlled oscillator to produce a gain signal; and a gain controller, in response to the gain signal produced by the comparator, to control a gain of the programmable gain amplifier.

A seventh aspect of the present invention is a phase-locked loop filter circuit. The phase-locked loop filter circuit includes a phase-locked loop filter; a capacitor; a charging circuit to pre-charge the capacitor to a voltage of the phase-locked loop filter; and a switch to switch the capacitor into the phase-locked loop filter circuit to effect a phase-locked loop bandwidth.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAIL DESCRIPTION OF THE PRESENT INVENTION

Figure 1:
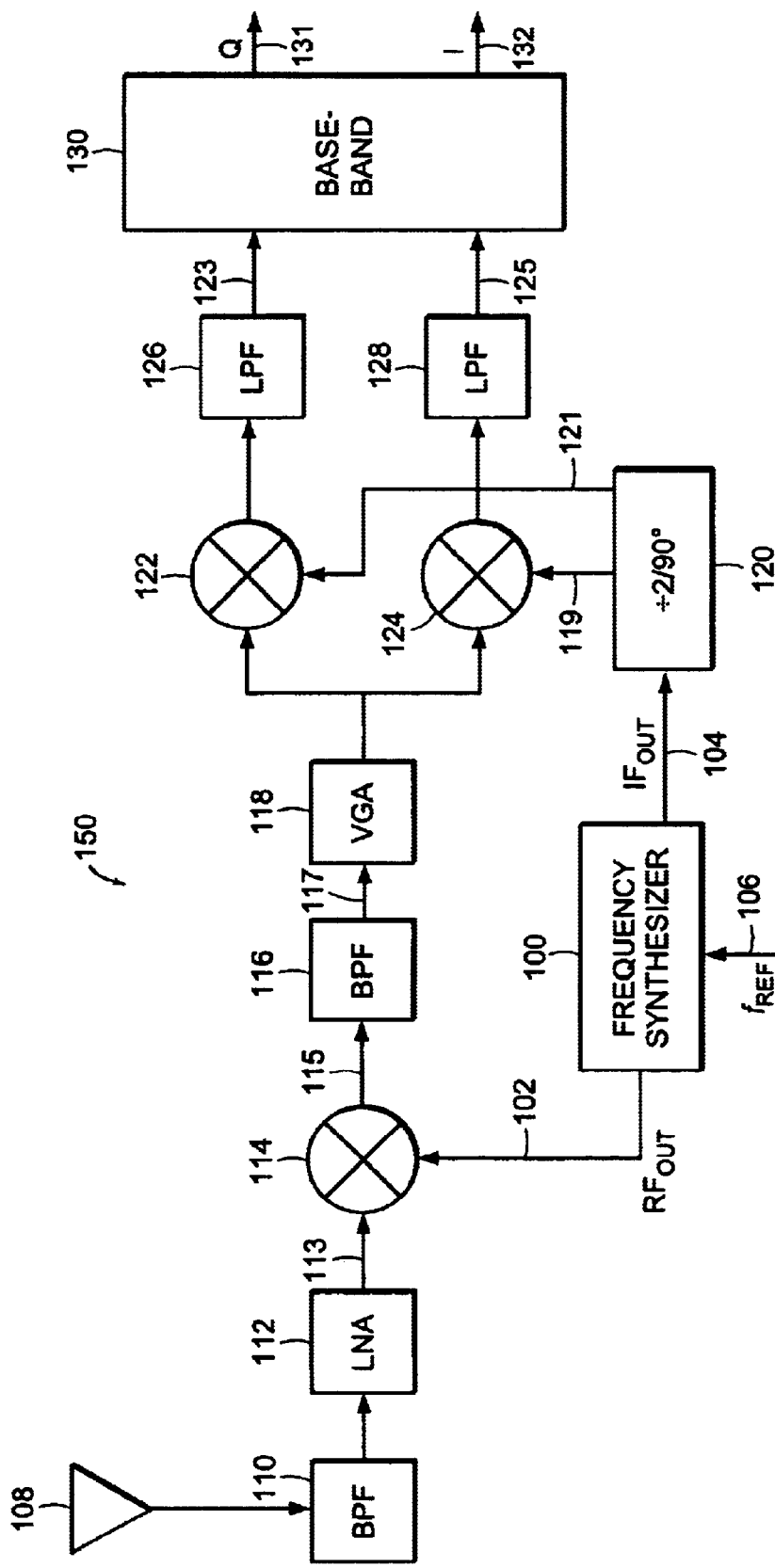
FIG. 1 illustrates a prior art receive path for a wireless communication device.
Figure 2:
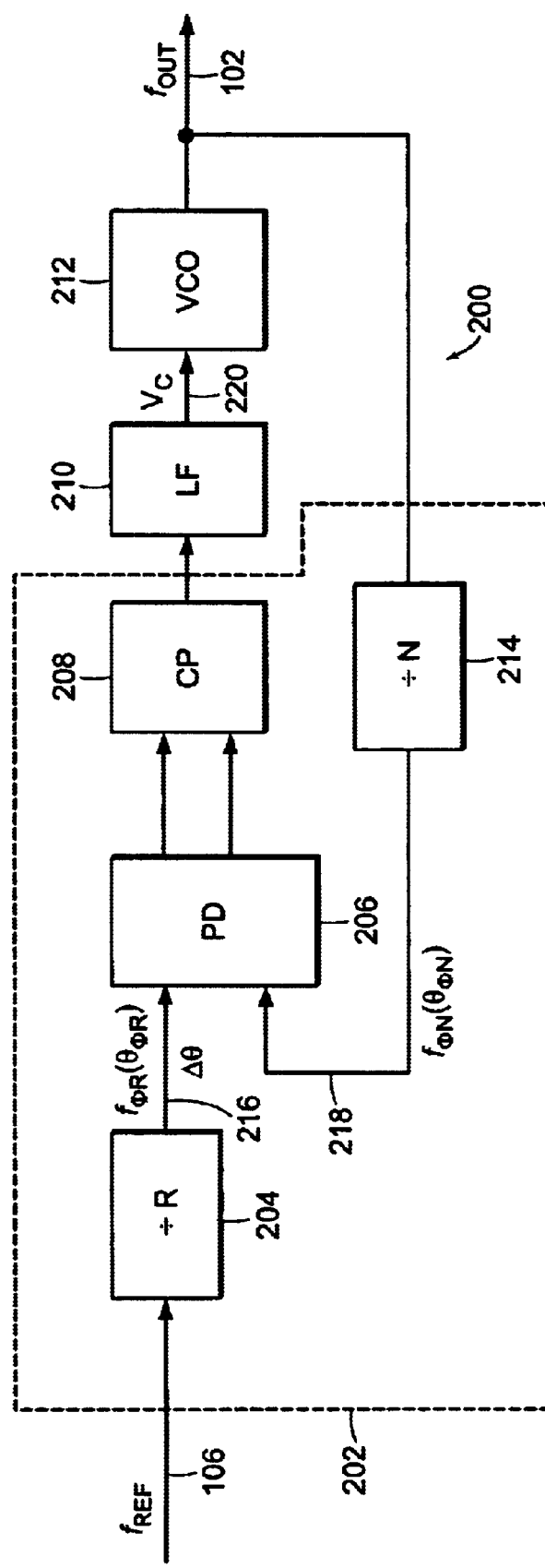
FIG. 2 illustrates a prior art phase-locked loop for synthesizing one of the frequencies required by a frequency synthesizer.
Figure 3:
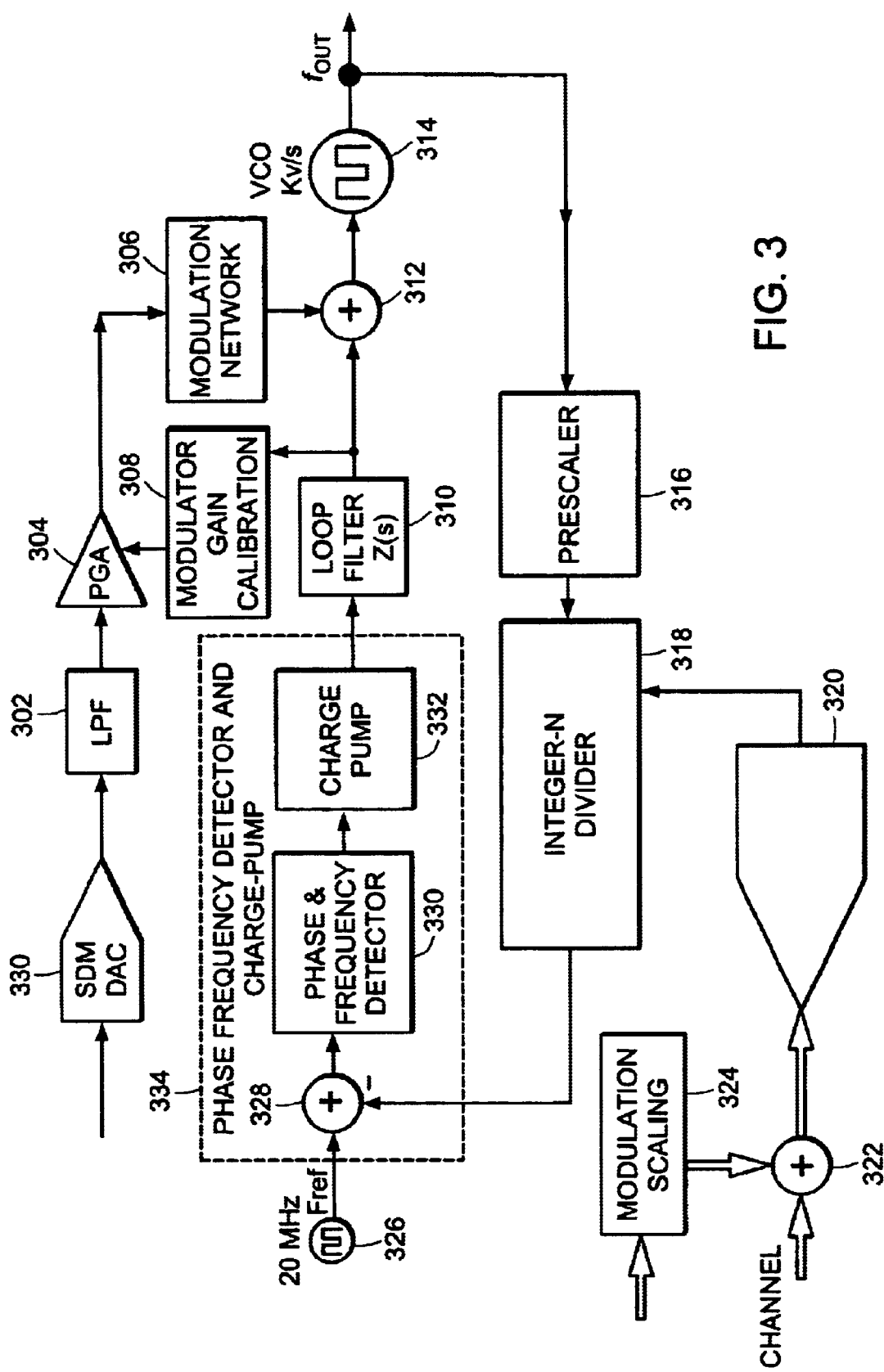
FIG. 3 illustrates a block diagram of one embodiment of a modulator according to the concepts of the present invention.

As noted above, the present invention contemplates a method and apparatus for synthesizing high-frequency signals by implementing a phase-locked loop frequency synthesizer with a voltage controlled oscillator. FIG. 3 illustrates an example of an apparatus for synthesizing high-frequency signals by implementing a phase-locked loop frequency synthesizer with a voltage controlled oscillator according to the concepts of the present invention.

As shown in FIG. 3, a sigma-delta modulator and digital to analog converter circuit 300 receives a Gaussian frequency shifted key signal. The sigma-delta modulator and digital to analog converter circuit 300 modulates and converts the signal to an analog signal. Upon leaving the sigma-delta modulator and digital to analog converter circuit 300, the analog signal is filtered by lowpass filter 302. The filtered signal is scaled by programmable gain amplifier 304 and then attenuated by modulation attenuation circuit 306 before being fed into a summing circuit 312.

The programmable gain amplifier 304 will be discussed in more detail with respect to FIG. 7. Moreover, the modulation attenuation circuit 306 will be discussed in more detail with respect to FIGS. 4 and 5. The summing circuit 312 may be any general summer circuit.

FIG. 3 further illustrates a phase-locked loop. The phase-locked loop includes a phase frequency detector and charge circuit 334 that effecting a subtraction of phase 328, a phase and frequency detector 330, and a charge pump 332. The phase and frequency detector 330 produces an output proportional to the phase difference between a frequency source 326 and a signal from an integer-N divider 318. Based upon the output from the phase and frequency detector 330, the charge pump is controlled to output a predetermined current to a loop filter 310. In a preferred embodiment, the charge pump 332 is programmable to one of five levels.

The signal from the loop filter 310 is fed to summing circuit 312 and modulator gain calibration circuit 308. The modulator gain calibration circuit 308 will be discussed in more detail with respect to FIG. 8. The summed signal from summing circuit 312 is fed to a voltage-controlled oscillator 314, which produces an output frequency based upon the received voltage.

The output frequency is fed back through the phase-locked loop through prescaler 316. The scaled signal is fed to integer-N divider 318. The integer-N divider 318 sums the received scaled signal with a signal from a sigma-delta modulation circuit 320. The sigma-delta modulation circuit is connected to a summer circuit 322 that sums a channel signal with a signal from a modulation scaling circuit 324. The modulation scaling circuit 324 scales a Gaussian frequency shifted key signal.

In operations, the device of FIG. 3, during transmit, the voltage-controlled oscillator 314 is modulated by Gaussian frequency shifted key data by summing an appropriate signal into the voltage-controlled oscillator 314 control voltage input and into the sigma-delta modulator input. The phase-locked loop responds to the modulation within the phase-locked loop's bandwidth and attempts to cancel out the modulation. Employing the two-point modulation illustrated in FIG. 3 mitigates this effect.

The modulation is applied to the voltage-controlled oscillator 314 using the sigma-delta modulator/digital to analog converter (300), lowpass filter (302), programmable gain amplifier (304), modulation attenuation network (306), and summer 312 path. As noted above, the sigma-delta modulator/digital to analog converter 300 output is lowpass filtered, scaled to compensate for changes in the voltage-controlled oscillator Kv, attenuated, and then applied to the voltage-controlled oscillator 314. The input digital signal is also summed into the phase-locked loop sigma-delta modulator after appropriate scaling through the modulation scaling circuit 324, summer circuit 322, and sigma-delta modulation circuit 320 path.

Figure 4:
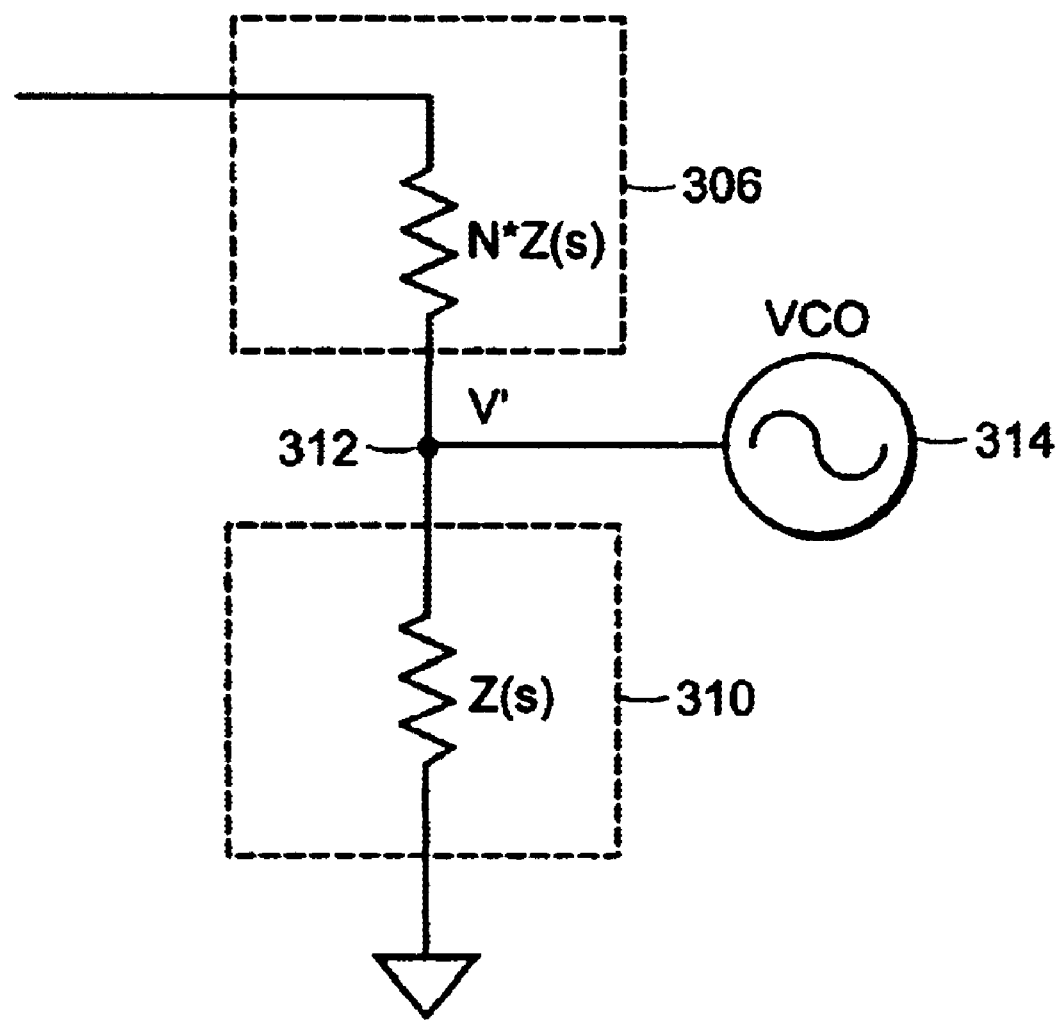
FIG. 4 illustrates one embodiment of a modulator impedance attenuator according to the concepts of the present invention.

FIG. 4 illustrates the attenuation concept of the present invention. As illustrated in FIG. 4, a signal from the programmable gain amplifier 306 is received by modulation attenuation network 306, which has an impedance of N*Z (s), and fed to a summing circuit 312. The summing circuit 312 further receives a signal from loop filter 310, which has an impedance of Z(s). The summed signal is fed to voltage-controlled oscillator 314.

As illustrated in FIG. 4, the Gaussian frequency shifted key modulation is applied through the modulation attenuation network 306. The phase-locked loop filter 310 is left connected to the voltage-controlled oscillator 314 during transmit. The impedance of the modulation attenuation network 306, N*Z(s), is a scaled version of the impedance (Z(s)) of the phase-locked loop filter 310. The combination of the modulation attenuation network 306 and the phase-locked loop filter 310 attenuates the modulation voltage by 1/(N+1).

In a preferred embodiment of the present invention, N=10 resulting in an attenuation of 1/11. This attenuation of 1/11 enables that when the input peak voltage is 54 mV to 107 mV being received by the attenuator, the resulting peak voltage at the voltage-controlled oscillator 314 is between 4.9 mV and 9.7 mV.

Figure 5:
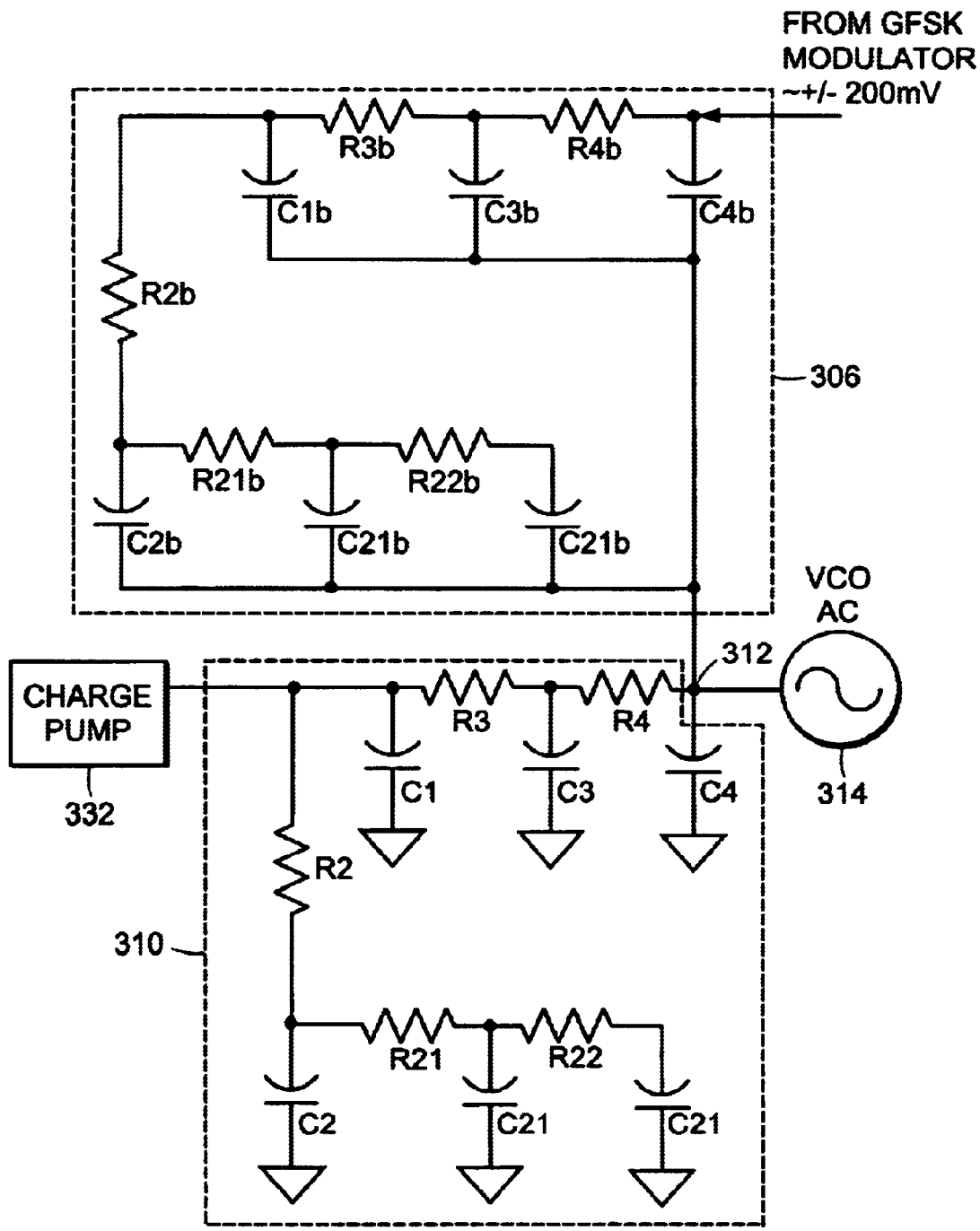
FIG. 5 illustrates another embodiment of a modulator impedance attenuator according to the concepts of the present invention.

FIG. 5 illustrates, in more detail, an embodiment of the attenuation circuitry of FIG. 4. As illustrated in FIG. 5, the modulation attenuation network 306, which has an impedance of N*Z(s), comprises a plurality of resistors (R3b, R4b, R2b, R21b & R22b) and a plurality of capacitors (C1b, C2b, C3b, C4b, C21b & C22b), wherein resistor R4b and capacitor C4b are connected to an input from the programmable gain amplifier 304. The phase-locked loop filter 310 comprises a plurality of resistors (R3, R4, R2, R21 & R22) and a plurality of capacitors (C1, C2, C3, C4, C21 & C22), wherein resistors R2 and R3 and capacitor C1 are connected to an input from the charge pump 322. The summing circuit 312 receives a signal from the phase-locked loop filter 310 and a signal from the modulation attenuation network 306. The summed signal is fed to voltage-controlled oscillator 314.

Figure 6:
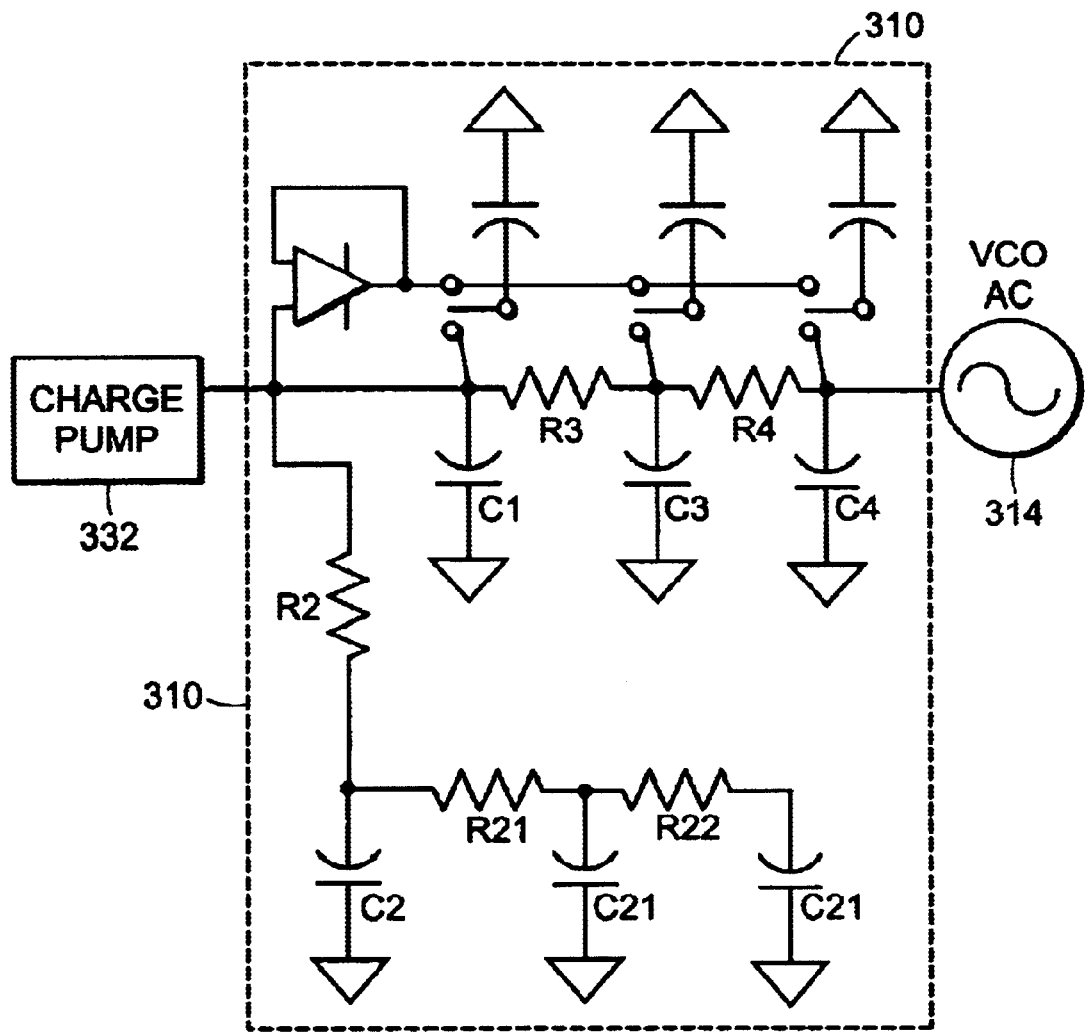
FIG. 6 illustrates a loop filter for a modulator according to the concepts of the present invention.

FIG. 6 illustrates another embodiment of a phase-locked loop filter used by the present invention. As illustrated in FIG. 6, the phase-locked loop filter 310 comprises a plurality of resistors (R3, R4, R2, R21 & R22), a plurality of capacitors (C1, C2, C3, C4, C10, C13, C14, C21 & C22), and a buffer amplifier A1, wherein capacitors C1, C3, C4, C10, C13, & C14 are switchable.

In a preferred embodiment of the present invention, as illustrated by FIG. 6, the phase-locked loop uses a programmable charge pump 332 to set the phase-locked loop bandwidth between 20 kHz and 500 kHz. The phase-locked loop filter 310 integrates the charge pump output through capacitor C2 and provides phase lead-lag frequency compensation to the phase-locked loop through resistor R2 and capacitor C1. Additional filter poles are added to roll-off the response above the phase-locked loop cutoff through resistors R3 and R4 and capacitors C3 and C4. The phase-locked loop filter 310 response is extended over a broader range by adding additional integration resistors/capacitors R21, C21, R22 & C22.

In a preferred embodiment, at the lowest bandwidth setting, additional capacitance (C10, C13 & C14) is switched into the phase-locked loop circuit to provide sufficient rejection at a predetermined offset. A buffer amplifier A1 pre-charges the capacitors (C10, C13 & C14) to the phase-locked loop filter 310 DC voltage to minimize disturbance to the phase-locked loop when the capacitors (C10, C13 & C14) are switched into the loop.

Figure 7:
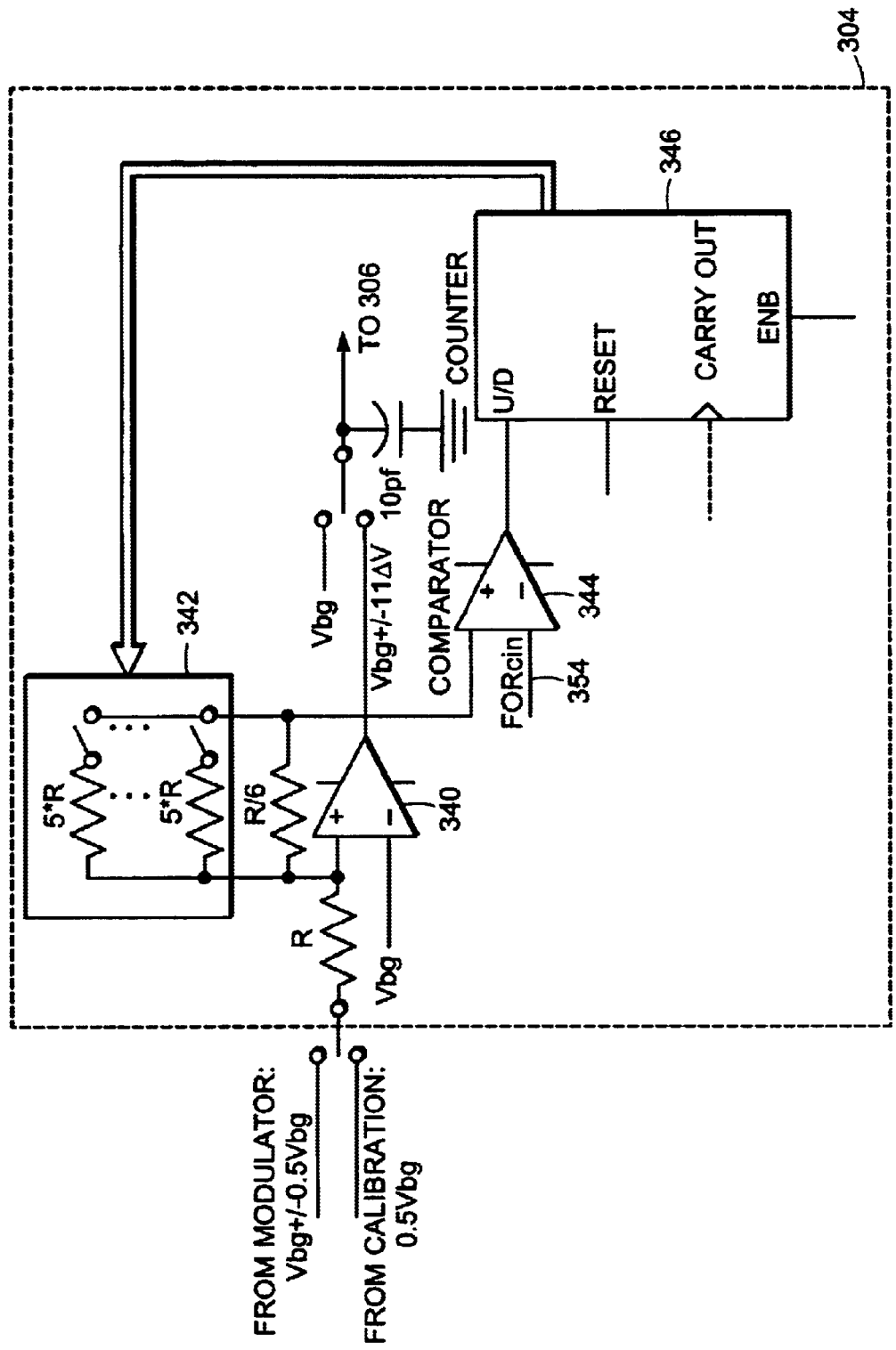
FIG. 7 illustrates an embodiment of a programmable gain amplifier for a modulator according to the concepts of the present invention.

FIG. 7 illustrates an embodiment of a programmable gain amplifier 304. The programmable gain amplifier 304 includes an amplifier 340 that has a switch, which switches between the lowpass filter 302 and a reference calibration signal, and a programmable feedback resistor bank 342 connected to one input and a reference signal connected to another input. The output of amplifier 340 is connected to another switch, which switches between the output of the amplifier 340 or a reference signal being applied to the modulation attenuation circuit 306, and the programmable feedback resistor bank 342.

The output of amplifier 340 is also connected to a comparator 344, which compares the output of the amplifier 340 with a signal from the modulation gain calibration circuit 308. The results of the comparison from comparator 344 are fed to an up/down control input of a counter 346. The counter 346 produces a count value in response thereto, wherein the count value is used to control the programmable feedback resistor bank 342.

When transmitting, the programmable gain amplifier 304, in a preferred embodiment, input full scale range is between 0.5 Vbg and 1.5 Vbg. When the input voltage is at the two extremes, the voltage-controlled oscillator needs to deviate by +/−80 kHz. The calibration circuit/process of the present invention, as illustrated in FIGS. 7 and 8, adjusts the programmable gain amplifier 304 voltage gain to accomplish correct scaling by calibration prior to each transmit slot.

To calibrate, the programmable gain amplifier 304 input is switched to 0.5 Vbg, resulting in the programmable gain amplifier 304 output voltage to be Vbg+0.5 Vbg*$G_{PGA}$, wherein $G_{PGA}$ is the gain of the programmable gain amplifier 304. The output voltage is compared to Vbg plus the voltage necessary at the programmable gain amplifier 304 output to produce a 80 kHz shift in the voltage-controlled oscillator. The comparator 344 output connects to a up/down counter 346. The gain of the programmable gain amplifier 304 is adjusted such that a full-scale input to the programmable gain amplifier 304 will result in an 80 kHz deviation of the voltage-controlled oscillator through the voltage-controlled oscillator modulation network.

Figure 8:
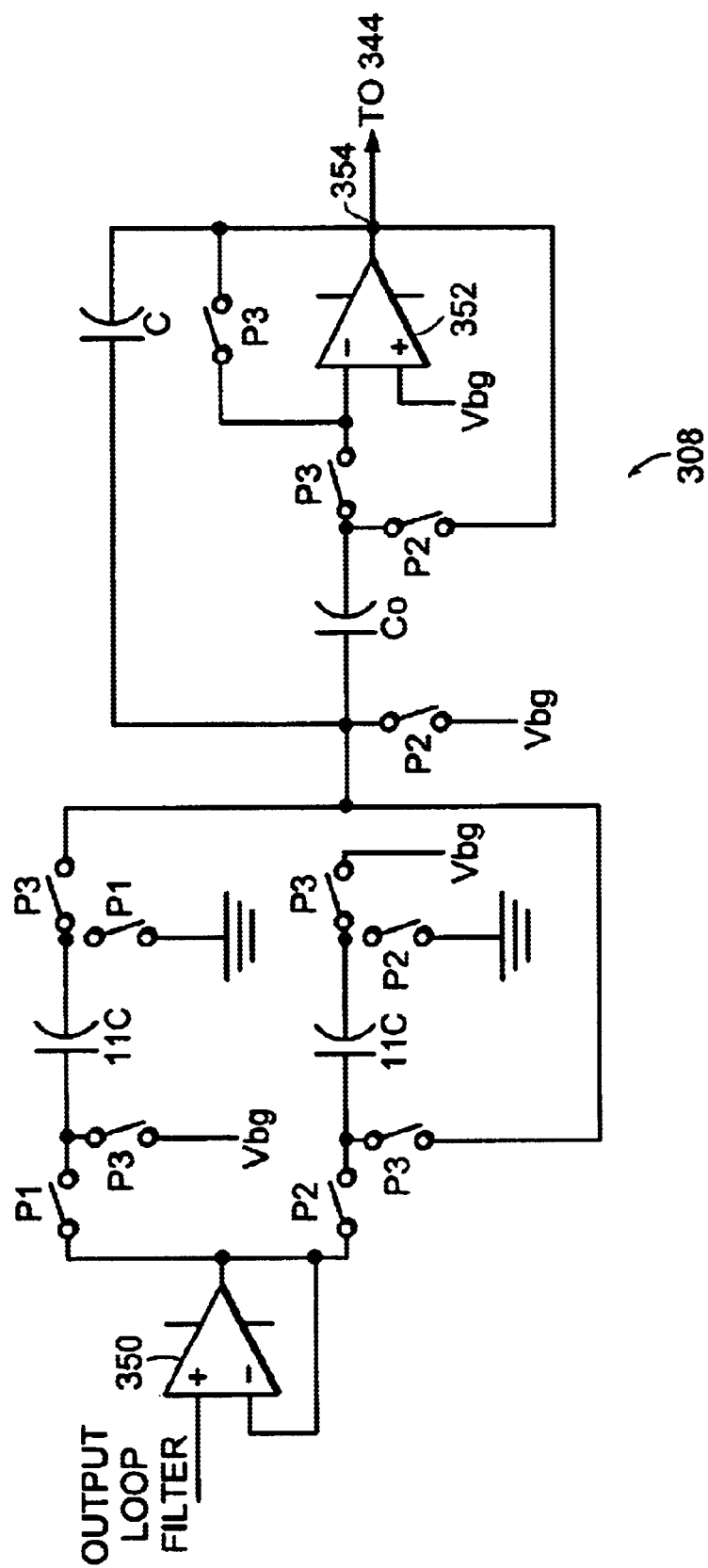
FIG. 8 illustrates an embodiment of a modulation gain calibration measuring circuit for a modulator according to the concepts of the present invention.

FIG. 8 illustrates a circuit used to measure the calibration voltage in the preferred embodiment of the present invention. As illustrated in FIG. 8, output from the phase-locked loop filter 310 is received by a buffer amplifier 350. Thereafter, a plurality of ganged switches (P1, P2 & P3) and capacitors (21C, 11C, C & $C_0$) are used to capture the calibration voltages. Another buffer amplifier 352 is used, along with a summer 354, to produce an output signal to be fed to comparator 344 of FIG. 7.

In a preferred calibration operation, the circuit of FIG. 8 initially sets the phase-locked loop at an 80 kHz offset and allows the phase-locked loop to settle. The voltage-controlled oscillator voltage is measured onto capacitor 21C by closing the ganged switches P1. The phase-locked loop is then reprogrammed to the channel center and again allowed to settle. The voltage-controlled oscillator voltage is sampled onto capacitor 11C by closing ganged switches P2. The two voltages are then subtracted and scaled up by N+1 to compensate for the modulator attenuation.

In summary, the present invention includes a phase-locked loop filter and an impedance circuit operatively connected to the phase-locked loop filter and a voltage controlled oscillator to provide proper attenuation of the modulated signal. The impedance circuit is a scaled version of the phase-locked loop filter wherein the phase-locked loop filter has an impedance of Z(s) and the impedance circuit has an impedance of N*Z(s) to provide an attenuation of 1/(N+1).

Moreover, the present invention calibrates the gain of the modulator by locking a voltage-controlled oscillator at a center frequency of a band and measuring a voltage of the locked voltage controlled oscillator. The present invention further shifts the voltage-controlled oscillator to produce a predetermined frequency and measures a voltage of the shifted voltage controlled oscillator. A difference between the measured voltage of the locked voltage controlled oscillator and the measured voltage of the shifted voltage controlled oscillator is determined and a gain of the modulator is changed based on the determined difference.

Lastly, the present invention includes a Gaussian frequency shift key generator, a modulator, a programmable gain amplifier to receive either a signal from the modulator or a calibration signal, a comparator for comparing a voltage of an output from the programmable gain amplifier with a voltage necessary to produce a predetermined frequency shift in a voltage-controlled oscillator to produce a gain signal, and a gain controller, in response to the gain signal produced by the comparator, to control a gain of the programmable gain amplifier.

While various examples and embodiments of the present invention have been shown and described, it will be appreciated by those skilled in the art that the spirit and scope of the present invention are not limited to the specific description and drawings herein, but extend to various modifications and changes all as set forth in the following claims.

What is claimed is:

1. A modulator gain calibration circuit, comprising:
    a programmable gain amplifier to receive either a signal from a modulator or a calibration signal;
    a comparator for comparing a voltage of an output from said programmable gain amplifier with a voltage necessary to produce a predetermined frequency shift in a voltage-controlled oscillator to produce a gain signal; and
    a gain controller, in response to said gain signal produced by said comparator, to control a gain of said programmable gain amplifier.

2. The modulator gain calibration circuit as claimed in claim 1, wherein said gain controller includes a counter and a plurality of resistors, said plurality of resistors being switchable into or out of a circuit connected between an output of said programmable gain amplifier and an input of said programmable gain amplifier.

3. The modulator gain calibration circuit as claimed in claim 1, wherein said predetermined frequency shift in the voltage-controlled oscillator is 80 kHz.

4. The modulator gain calibration circuit as claimed in claim 1, wherein said gain controller controls the gain of said programmable gain amplifier such that a full scale input to said programmable gain amplifier produces said predetermined frequency shift in the voltage-controlled oscillator.

5. The modulator gain calibration circuit as claimed in claim 4, wherein said predetermined frequency shift in the voltage-controlled oscillator is 80 kHz.

6. A method of calibrating a gain of a modulator, comprising:
    (a) locking a voltage controlled oscillator at a center frequency of a band;
    (b) measuring a voltage of the locked voltage controlled oscillator;
    (c) shifting the voltage controlled oscillator to produce a predetermined frequency;
    (d) measuring a voltage of the shifted voltage controlled oscillator;
    (e) determining a difference between the measured voltage of the locked voltage controlled oscillator and the measured voltage of the shifted voltage controlled oscillator; and
    (f) changing a gain of the modulator based on the determined difference.

7. The method as claimed in claim 6, wherein the predetermined frequency shift in the voltage-controlled oscillator is 80 kHz.

8. The method as claimed in claim 6, wherein the gain is changed such that a full scale input to the modulator produces the predetermined frequency shift in the voltage-controlled oscillator.

9. The method as claimed in claim 8, wherein the predetermined frequency shift in the voltage-controlled oscillator is 80 kHz.

10. A modulation circuit, comprising:
   a Gaussian frequency shift key generator;
   a modulator;
   a programmable gain amplifier to receive either a signal from said modulator or a calibration signal;
   a comparator for comparing a voltage of an output from said programmable gain amplifier with a voltage necessary to produce a predetermined frequency shift in a voltage-controlled oscillator to produce a gain signal; and
   a gain controller, in response to said gain signal produced by said comparator, to control a gain of said programmable gain amplifier.

11. The modulation circuit as claimed in claim 10, wherein said gain controller includes a counter and a plurality of resistors, said plurality of resistors being switchable into or out of a circuit connected between an output of said programmable gain amplifier and an input of said programmable gain amplifier.

12. The modulation circuit as claimed in claim 10, wherein said predetermined frequency shift in the voltage-controlled oscillator is 80 kHz.

13. The modulation circuit as claimed in claim 10, wherein said gain controller controls the gain of said programmable gain amplifier such that a full scale input to said programmable gain amplifier produces said predetermined frequency shift in the voltage-controlled oscillator.

14. The modulation circuit as claimed in claim 13, wherein said predetermined frequency shift in the voltage-controlled oscillator is 80 kHz.

15. The modulation circuit as claimed in claim 10, further comprising:
   a first impedance;
   a voltage controlled oscillator operatively connected to said first impedance during transmit; and
   a second impedance operatively connected to said first impedance and said voltage controlled oscillator;
   said second impedance circuit being a scaled version of said first impedance.

16. The modulation circuit as claimed in claim 15, wherein said said first impedance has an impedance of Z(s) and said second impedance has an impedance of N*Z(s).

17. The modulation circuit as claimed in claim 16, wherein said second impedance attenuates a received modulation voltage by $1/(N+1)$.

18. The modulation circuit as claimed in claim 15, further comprising a charge pump operatively connected to said first impedance.

19. The modulation circuit as claimed in claim 10, further comprising:
   a phase-locked loop filter circuit;
   a summing network circuit, operatively connected to said phase locked loop filter circuit and said programmable gain amplifier, to sum an output of to said phase-locked loop filter circuit and an output of said programmable gain amplifier; and
   a voltage controlled oscillator operatively connected to said summing network circuit.

20. The modulation circuit as claimed in claim 19, wherein said phase-locked loop filter circuit includes,
   a phase-locked loop filter;
   a capacitor;
   a charging circuit to pre-charge said capacitor to a voltage of said phase-locked loop filter; and
   a switch to switch said capacitor into said phase-locked loop filter circuit to effect a phase-locked loop bandwidth.

* * * * *